(12) United States Patent
Narag et al.

(10) Patent No.: US 9,482,416 B2
(45) Date of Patent: Nov. 1, 2016

(54) FLEXIBLE LIGHT EMITTING SEMICONDUCTOR DEVICE HAVING A THREE DIMENSIONAL STRUCTURE

(71) Applicant: 3M INNOVATION PROPERTIES COMPANY, St. Paul, MN (US)

(72) Inventors: Alejandro Aldrin II Agcaoili Narag, Singapore (SG); Ravi Palaniswamy, Singapore (SG); Arokiaraj Jesudoss, Singapore (SG); Justine A. Mooney, Austin, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 151 days.

(21) Appl. No.: 14/357,687

(22) PCT Filed: Nov. 20, 2012

(86) PCT No.: PCT/US2012/066020
§ 371 (c)(1),
(2) Date: May 12, 2014

(87) PCT Pub. No.: WO2013/078180
PCT Pub. Date: May 30, 2013

(65) Prior Publication Data
US 2014/0321126 A1 Oct. 30, 2014

Related U.S. Application Data

(60) Provisional application No. 61/563,211, filed on Nov. 23, 2011.

(51) Int. Cl.
*F21V 21/14* (2006.01)
*F21K 99/00* (2016.01)
(Continued)

(52) U.S. Cl.
CPC ............... *F21V 21/14* (2013.01); *F21K 9/00* (2013.01); *F21K 9/135* (2013.01); *F21V 29/004* (2013.01);
(Continued)

(58) Field of Classification Search
CPC ........ F21V 29/004; F21V 21/14; F21V 3/00; H05K 2201/09063; H05K 1/189; H05K 2201/10106; H05K 2201/047; H05K 2201/053; H05K 1/028; H01L 2924/0002; H01L 2924/00; H01L 25/0753; F21K 9/135; F21K 9/00; F21W 2121/00; F21W 2101/00; F21Y 2101/02; F21Y 2111/007; F21Y 2111/001
USPC ........................................................ 362/360
See application file for complete search history.

(56) References Cited

U.S. PATENT DOCUMENTS 7,086,756 B2 * 8/2006 Maxik ..................... F21K 9/135
362/249.04
7,284,882 B2 10/2007 Burkholder
(Continued)

FOREIGN PATENT DOCUMENTS

CN 201589090 9/2010
WO WO 2012-061010 5/2012
(Continued)

OTHER PUBLICATIONS

Panasonic ideas for life, Panasonic Electric Works Co., Ltd., 2010, 12 pages.
(Continued)

*Primary Examiner* — Laura Tso
*Assistant Examiner* — Naomi M Wolford
(74) *Attorney, Agent, or Firm* — Melanie G. Gover; Clifton F. Richardson

(57) ABSTRACT

Provided is an article comprising a flexible circuit comprising a polymeric dielectric layer having first and second major surfaces, one or both of the first and second major surfaces having a conductive layer thereon, wherein at least one conductive layer comprises an electrical circuit configured to power one or more light emitting semi-conductor devices located on the flexible circuit, wherein the flexible circuit is shaped to form a three dimensional structure.

13 Claims, 6 Drawing Sheets

(51) Int. Cl.
*H05K 1/18* (2006.01)
*F21V 29/00* (2015.01)
*H01L 25/075* (2006.01)
*F21V 3/00* (2015.01)
*F21W 101/00* (2006.01)
*F21W 121/00* (2006.01)
*F21Y 101/02* (2006.01)
*F21Y 111/00* (2016.01)
*H05K 1/02* (2006.01)

(52) U.S. Cl.
CPC ............... *H05K 1/189* (2013.01); *F21V 3/00* (2013.01); *F21W 2101/00* (2013.01); *F21W 2121/00* (2013.01); *F21Y 2101/02* (2013.01); *F21Y 2111/001* (2013.01); *F21Y 2111/007* (2013.01); *H01L 25/0753* (2013.01); *H01L 2924/0002* (2013.01); *H05K 1/028* (2013.01); *H05K 2201/047* (2013.01); *H05K 2201/053* (2013.01); *H05K 2201/09063* (2013.01); *H05K 2201/10106* (2013.01)

(56) References Cited

U.S. PATENT DOCUMENTS

| | | | |
|---|---|---|---|
| 7,645,047 B2 | 1/2010 | Martinez | |
| 7,824,046 B2 | 11/2010 | Martinez | |
| 7,841,741 B2 | 11/2010 | Chan | |
| 7,878,668 B2 | 2/2011 | Martinez | |
| 7,976,187 B2 | 7/2011 | Villard | |
| 2005/0207156 A1* | 9/2005 | Wang | F21K 9/00 |
| | | | 362/240 |
| 2006/0193130 A1* | 8/2006 | Ishibashi | F21K 9/135 |
| | | | 362/227 |
| 2006/0292722 A1 | 12/2006 | Becker | |
| 2007/0120089 A1 | 5/2007 | Mao | |
| 2008/0067533 A1* | 3/2008 | Lim | H01L 33/486 |
| | | | 257/98 |
| 2008/0238323 A1 | 10/2008 | Chan | |
| 2008/0284308 A1 | 11/2008 | Pang | |
| 2009/0009977 A1* | 1/2009 | Enomoto | H05K 1/189 |
| | | | 361/749 |
| 2011/0163681 A1 | 7/2011 | Dau | |
| 2012/0049732 A1 | 3/2012 | Chuang | |
| 2012/0062151 A1 | 3/2012 | Lin | |

FOREIGN PATENT DOCUMENTS

| | | |
|---|---|---|
| WO | WO 2012-061182 | 5/2012 |
| WO | WO 2012-061183 | 5/2012 |
| WO | WO 2012-061184 | 5/2012 |
| WO | WO 2012-112310 | 8/2012 |
| WO | WO 2013-025402 | 2/2013 |

OTHER PUBLICATIONS

International Search Report for PCT Application No. PCT/US2012/066020 mailed on Mar. 29, 2013, 3 pages.

* cited by examiner

FLEXIBLE LIGHT EMITTING SEMICONDUCTOR DEVICE HAVING A THREE DIMENSIONAL STRUCTURE

CROSS REFERENCE TO RELATED APPLICATIONS

This application is a national stage filing under 35 U.S.C. 371 of PCT/US2012/066020, filed Nov. 20, 2012, which claims priority to Provisional Application No. 61/563,211, filed Nov. 23, 2011, the disclosure of which is incorporated by reference in its/their entirety herein.

TECHNICAL FIELD

This invention relates to flexible light emitting semiconductor devices.

BACKGROUND

Conventional light emitting semi-conductor (LES) devices (LESDs), including light emitting diodes (LEDs) and laser diodes, and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by a buildup of heat generated from within the devices, as well as heat from sunlight in the case of outside lighting applications. Excessive heat buildup can cause deterioration of the materials used in the LES devices, such as encapsulants for the LESDs. When LESDs are attached to flexible-circuit laminates, which may also include other electrical components, the heat dissipation problems are greatly increased.

Additionally, conventional LES devices and packages tend to be thick, which limits their uses in low form factor applications. Consequently, there is a continuing need to improve the design of flexible LES devices and packages to improve their thermal dissipation properties, as well as to allow for their use in low form factors.

SUMMARY

At least one aspect of the present invention provides a light-producing article comprising LESDs supported by a flexible circuit configured into a three-dimensional article. Flexible circuits are well suited for such articles because they are thin and flexible and can be bent and folded into desired shapes. Additionally, the circuits may be patterned to provide LESDs in desired locations in the final configured articles. A common issue with light-producing articles such as those containing LEDs is heat management. Embodiments of the present invention can achieve desired heat management while also providing desired light-producing shapes and structures.

At least one aspect of the present invention provides a cost-effective thermal management solution for current and future high power LESD constructions through a robust flexible LESD construction. The ability to dissipate large amounts of heat is needed for the operation of high power LESD arrays. According to at least one embodiment of the present invention, heat dissipation can be managed by integrating the LESDs into a system having a flexible polymeric dielectric substrate, i.e., a dielectric layer. To accomplish better heat management, LESDs are positioned so they are in close or direct thermal contact with thermally conductive layers by controlling the thickness of the insulator (dielectric) material between the LESD and a thermally conductive layer or by completely removing the insulator material between the LESD and a thermally conductive layer. In at least one embodiment of the present invention, to achieve the desired positioning of the LESD controlled removal, e.g., by etching, of the dielectric layer to a desired thickness to form a cavity, or creating an opening completely through the dielectric layer to form a via, is performed. Etching of the dielectric layer may provide additional advantages by creating slanted side walls which can be coated with a reflecting material to provide enhanced light efficiency. Additionally, in at least some embodiments, because the LESD sits below the surface of the dielectric layer, it has a lower profile than standard LES devices, which makes it well-suited for low form factor applications.

At least one aspect of the present invention features an article comprising a flexible circuit having first and second sides comprising a polymeric dielectric layer having first and second major surfaces, one or both of the first and second major surfaces having a conductive layer thereon, wherein at least one conductive layer comprises an electrical circuit configured to power one or more light emitting semiconductor devices located on the flexible circuit, and wherein the flexible circuit is shaped to form a three dimensional structure.

As used in this application:

"LES" means light emitting semiconductor(s), including light emitting diode(s) and laser diode(s) and "LESD" means light emitting semiconductor device(s), including light emitting diode device(s) and laser diode device(s). An LESD may be a bare LES die construction, a complete packaged LES construction, or an intermediate LES construction comprising more than the bare die, but less than all the components for a complete LES package, such that the terms LES and LESD may be used interchangeably and refer to one or all of the different LES constructions. The term "flexible LES device" or "flexible LESD" typically refers to the flexible article containing the bare die light emitting semiconductor, packaged LES construction, or intermediate LES construction.

Another advantage of at least one embodiment of the present invention is that the cavity or via contains the encapsulant filling in a confined area. Another advantage of at least one embodiment of the present invention is that the LESDs on the flexible dielectric layer may be electrically connected in series, in parallel, or individually depending on the desired application. Another advantage of at least one embodiment of the present invention is that the flexible dielectric layer facilitates making a circuitry pattern on both sides of the substrate. Another advantage of at least one embodiment of the present invention is that the flexible substrate provides great flexibility and bendability for the LESD articles.

The above summary of the present invention is not intended to describe each disclosed embodiment or every implementation of the present invention. The Figures and detailed description that follow below more particularly exemplify illustrative embodiments.

DETAILED DESCRIPTION

In the following description, reference is made to the accompanying set of drawings that form a part of the description hereof and in which are shown by way of illustration several specific embodiments. In general similar reference numbers are used for similar features in the various embodiments. Unless indicated otherwise, these similar features may comprise the same materials, have the same attributes, and serve the same or similar functions. Additional or optional features described for one embodiment may also be additional or optional features for other embodiments, even if not explicitly stated, where appropriate. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc. In addition, directional terminology, such as "top," "bottom," "front" "back," "above," "below," etc., is used with reference to the orientation of the Figure(s) being described. Because components of embodiments can be positioned in a number of different orientations, the directional terminology is used for purposes of illustration and is in no way limiting.

Figure 1A:
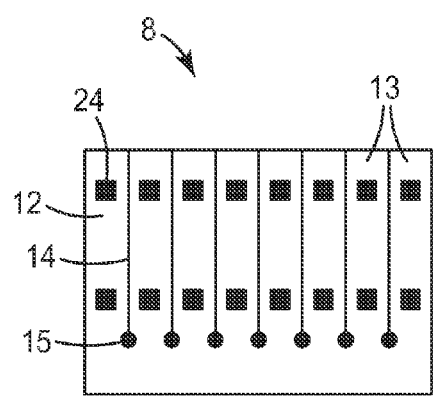
FIGS. 1A to 1D are front, perspective, side and top schematic views of an exemplary embodiment of a flexible LESD according to an aspect of the present invention.

An embodiment of the present invention is illustrated in FIGS. 1A to 1D. FIG. 1A shows a flexible LESD comprising flexible circuit 8, which includes a flexible polymeric dielectric layer 12 on which is located an array of LESDs 24 (conductive traces not shown). In the illustrated embodiment, the LESDs 24 are arranged in pairs on sections 13 of dielectric layer 12 separated by partition lines 14. In other embodiments, instead of a single LESD 24 at a particular location on a section 13, there may be multiple LESDs grouped together at a particular location. Alternatively, there could be a continuous line or lines of LESDs 24 extending along the length of the individual sections 13. The number and arrangement of the LESDs will depend on the desired use of the flexible LESD. Partition lines 14 can be mechanically formed such as by slitting or punching or can be formed by other methods such as chemical etching. Apertures 15 may be formed at the end of the partition lines 14. Apertures 15 are typically small opening in the dielectric substrate/flexible circuit that have rounded edges. They are intended to dissipate mechanical stress that may be applied to the ends of the partition lines, particularly when the flexible LESD is being handled, thereby reducing the incidence of the flexible circuit tearing at the ends of the partition lines. In other embodiments of the invention, areas of the dielectric substrate/flexible circuit larger than the illustrated apertures and partition lines may be removed to mitigate mechanical stress and tearing issues (or for design purposes). In some embodiments, such as is shown in the bottom portion of flexible circuit B in FIG. 4A, sections 13 of the dielectric substrate 12 may be made with round edges to eliminate the stress points that would be created by square edges.

Figure 1B:
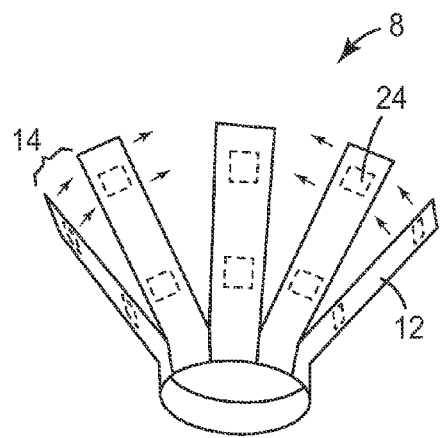
Figure 1C:
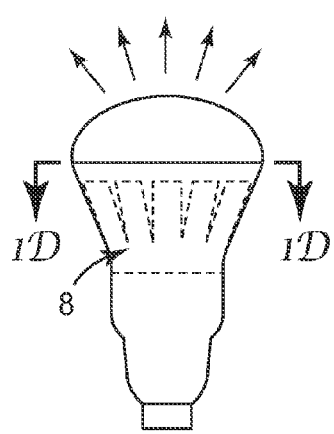
Figure 1D:
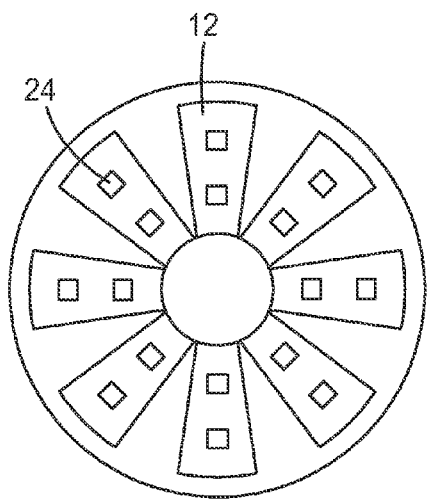

As shown in FIG. 1B, flexible circuit 8 can be bent such that a cylindrical bottom portion is formed with "fingers" extending therefrom. The fingers comprise the sections of the flexible circuit 8 separated by partition lines 14. They are separated from one another such that they flare from the bottom portion. In this embodiment, the LESDs 24 are on the inside of the structure. This embodiment of flexible circuit may be used in a light bulb, such as is illustrated in FIG. 1C. Flexible circuit 8 may be adhered, e.g., to a frustoconical support that forms a part of a light bulb. Flexible circuit 8 may be adhered to the support with a thermal interface material, such as a thermally conductive adhesive, to assist in the removal of heat from the LESDs. The frustoconical support may have a reflective surface to reflect light generated by the LESDs. FIG. 1D is a cross-sectional view of the light bulb of FIG. 1C in the direction of line 1D.

Figure 2A:
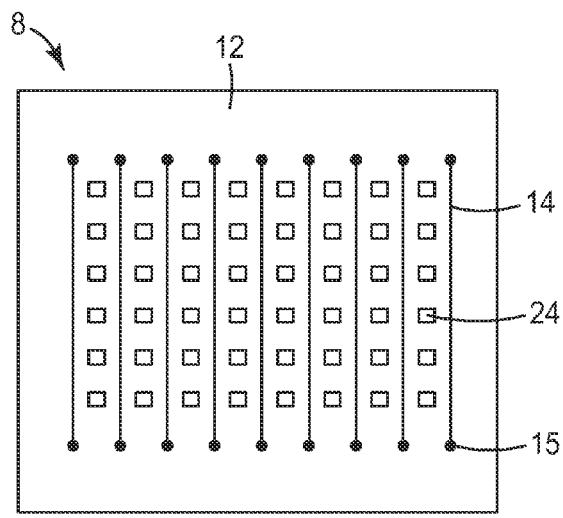
FIGS. 2A and 2B are front and perspective schematic views of another exemplary embodiment of a flexible LESD according to an aspect of the present invention.
Figure 2B:
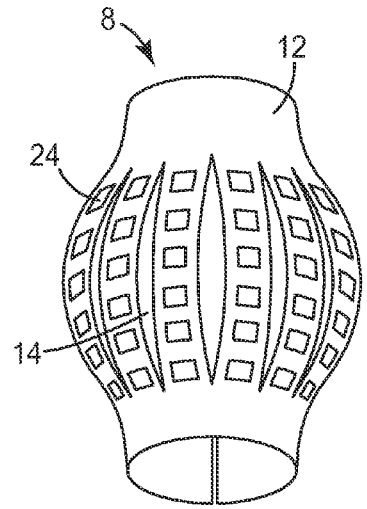

FIG. 2A shows another embodiment of a flexible LESD comprising a flexible circuit 8 similar to that of FIG. 1A, except that partition lines 14 extend only through the center area of flexible circuit 8 such that the upper and lower edges of dielectric substrate 12 are continuous. The flexible circuit of FIG. 2A may be formed into a cylinder and the cylinder may be compressed slightly such that the sections of flexible circuit 8 separated by partition lines 14 separate from each other and bulge outward to form the shape illustrated in FIG. 2B.

Figure 3A:
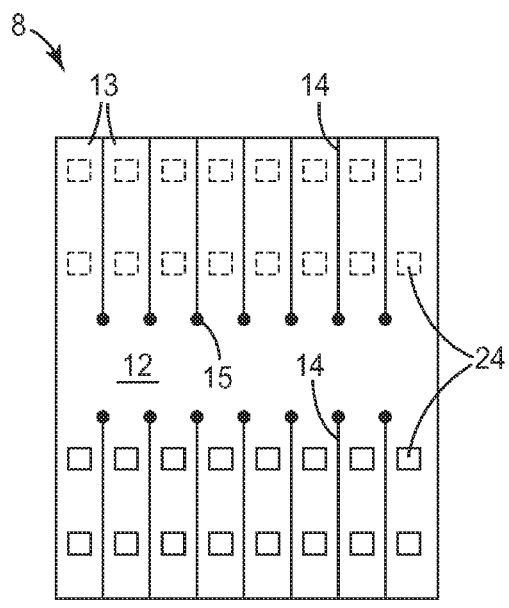
FIGS. 3A and 3B are front and perspective schematic views of another exemplary embodiment of a flexible LESD according to an aspect of the present invention.
Figure 3B:
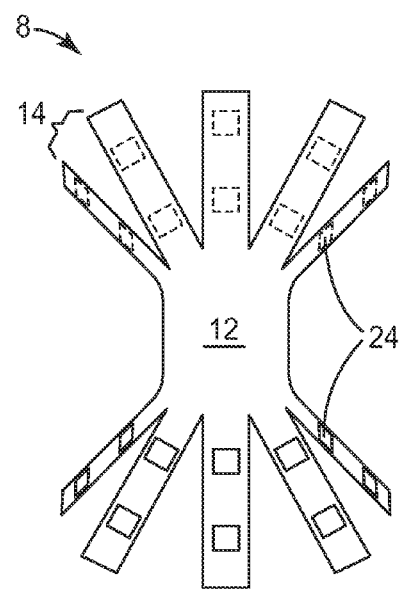

FIG. 3A shows yet another embodiment of a flexible LESD comprising a flexible circuit 8 similar to that of FIG. 1A. In this embodiment, the interior portion of dielectric layer 12 is continuous and two sets of partition lines 14 extend from the interior portion to the edges of dielectric layer 12. The flexible circuit of FIG. 3A may be formed into a cylinder and the sections of flexible circuit 8 separated by partition lines 14 may be separated and flared outward to form the shape illustrated in FIG. 2B. In this embodiment, an array of LESDs 24 on the upper portion of flexible circuit 8 are located on a first major surface of dielectric layer 12 and another array of LESDs on the lower portion of flexible circuit 8 are located on a second major surface of dielectric layer 12.

In the embodiments of FIGS. 1A-1B and 3A-3B, the sections of flexible circuit separated by partition lines 14 may be manipulated further to allow for the formation of different shapes. For examples, the individual separated sections could be bent or curled forward or backwards in relation to their illustrated positions.

Figure 4A:
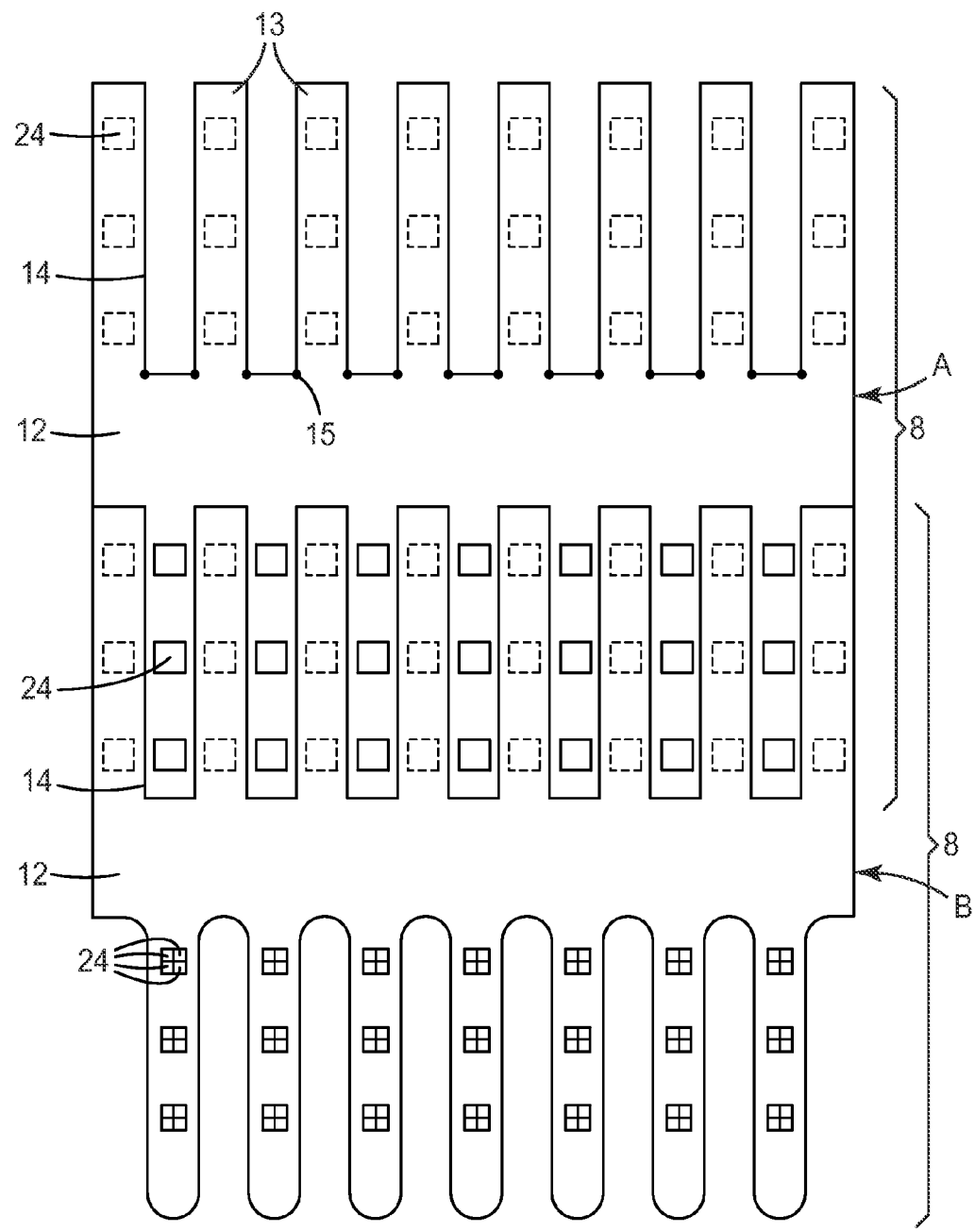
FIGS. 4A and 4B are schematic front views of another exemplary embodiment of a flexible LESD according to an aspect of the present invention.
Figure 4B:
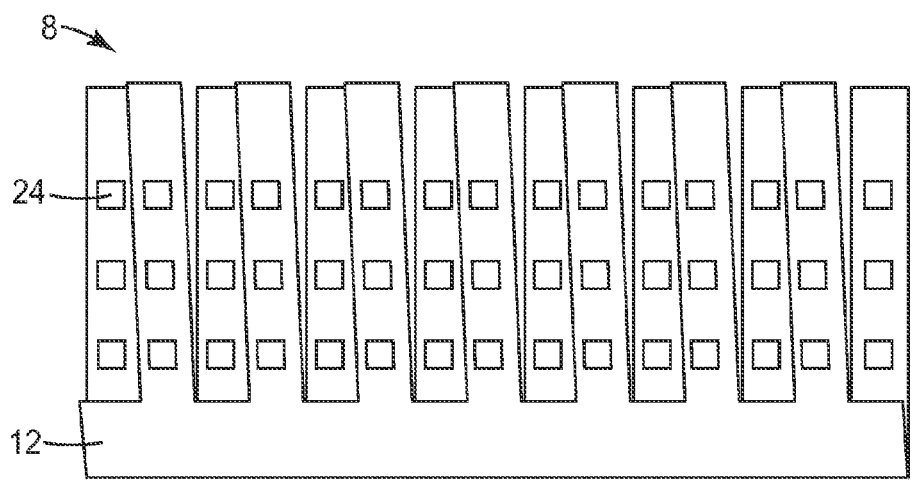

FIG. 4A illustrates another embodiment of a flexible LESD comprising flexible circuits 8. This embodiment illustrates how a flexible substrate can be patterned to form multiple flexible circuits. In the illustrated embodiment, the shape of the flexible circuit allows for an interlocking pattern of adjacent flexible circuits, A and B. This provides efficient use of the substrate material. The individual flexible circuits can be separated along partition lines 14, which form a continuous separation line between adjacent flexible circuits. Arrays of LESDs are located on both sides of dielectric layer 12. After the flexible circuits are separated, they may be bent or folded into any desired shape. FIG. 4B illustrates one possible shape in which the flexible circuit is folded in half. In this manner, the LESDs on both sides of the dielectric layer are brought into alignment, thereby forming a relatively dense array of LESDs. The flexible circuit may then be further manipulated, e.g., the entire structure bent into a cylinder shape, the individual sections of dielectric layer 12 bent in various directions, etc.

Figure 5A:
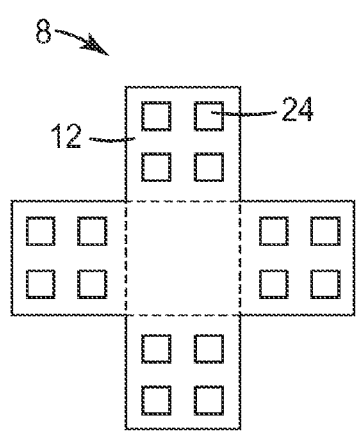
FIGS. 5A and 5B are front and perspective schematic views of another exemplary embodiment of a flexible LESD according to an aspect of the present invention.
Figure 5B:
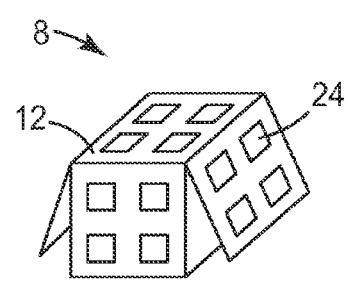

FIG. 5A illustrates another embodiment of a flexible LESD comprising a flexible circuit 8. In this embodiment, the flexible circuit is in the shape of a cross, which can be folded into a three dimensional "box" shape having LESDs on five surfaces. An alternative embodiment could be made in which the box had LESDs on all six sided. FIG. 5B illustrates how the flexible circuit 8 of FIG. 5A can be applied to a square substrate. In at least some embodiments, the square substrate may be a heat sink. In at least one embodiment, flexible circuit 8 may be attached to the heat sink by a thermal interface material, such as a conductive adhesive. In this manner, heat generated by the LESDs may be readily dissipated.

Figure 6A:
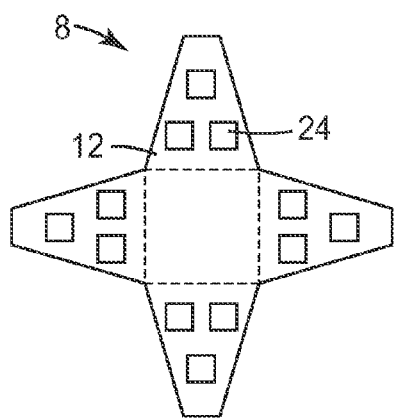
FIGS. 6A and 6B are front and perspective schematic views of another exemplary embodiment of a flexible LESD according to an aspect of the present invention.
Figure 6B:
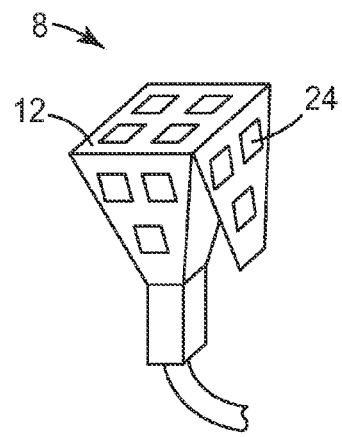

FIG. 6A illustrates another embodiment of a flexible LESD comprising a flexible circuit 8 similar to that of FIG. 5A except that the flexible circuit 8 of FIG. 6A will form more of a three dimensional "pyramid" shape having LESDs on all five surfaces. The pyramid is truncated so that the flexible circuit can fit around a pyramid-like substrate that includes a conduit, which conduit may be used, for example, to accommodate wiring. In at least some embodiments, the pyramid-like substrate may be a heat sink. In at least one embodiment, flexible circuit 8 may be attached to the heat sink by a thermal interface material, such as a conductive adhesive. In this manner, heat generated by the LESDs may be readily dissipated.

The flexible LESDs of the present invention may be formed into many three dimensional shapes suitable for a light emitting device. To form the three dimensional shapes, the flexible circuits may be bent or folded and may be slit or cut in any suitable manner to achieve the final desired three dimensional shape.

The conductive circuits of the flexible LESDs may have any pattern suitable for the intended use of the flexible circuit. The conductive circuits and, accordingly, the LESDs, may be powered by any suitable method known to one of skill in the art.

The LESDs may be mounted on the flexible circuits and electrically connected to the conductive circuits in any suitable manner. The LESDs may be bare dies, packaged dies, or intermediate products. The LESDs may be attached, directly, or indirectly, to a conductive layer or conductive material using a known die bonding method such as eutectic, solder, adhesive, and fusion bonding. They may be mounted on the surface of the dielectric substrate or may be placed in a cavity or via created in the dielectric substrate. In some embodiments, cavities and vias formed in the dielectric layer may contain thermally conductive materials to facilitate movement of heat away from the LESDs. Suitable configurations and methods of mounting the LESDs are described, for example, in co-pending PCT patent applications US2011/057980, US2011/057977, and US2011/057975 and co-pending U.S. provisional patent applications 61/444,337, 61/496,289 and 61/524,646, all of which are incorporated herein by reference. Additional examples of configurations for mounting LESDs in the present invention are illustrated in FIGS. 7-10. Although the embodiments of FIGS. 7, 8, 10, and 11 show cavities and vias having walls sloped in a particular direction, the cavity and via walls in alternate embodiments may slope in any direction or may be vertical. In some embodiments, there may be performance advantages to having a wall slope in a particular direction.

Figure 7:
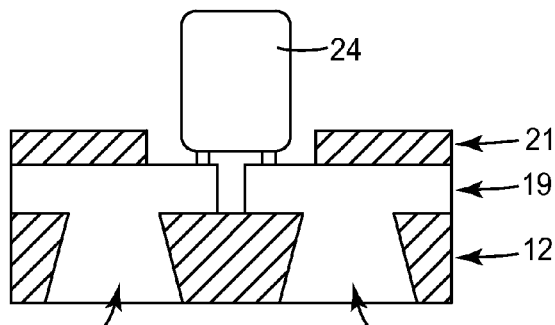
FIG. 7 is a schematic cross-sectional view of an exemplary embodiment of a flexible LESD according to an aspect of the present invention.

FIG. 7 illustrates a dielectric substrate 12 in which are created two vias 10 extending from the bottom surface to the top surface of dielectric layer 12. The vias are filled with conductive material. The conductive material in this embodiment is electrically conductive and preferably thermally conductive. Conductive layer 19 is patterned to form at least two sections that are electrically isolated from each other, but each of which are in electrical contact with the conductive material in one of the vias. Flip chip LESD 24 is mounted on conductive layer 19 such that each electrode is electrically connected to one of the isolated sections. Covercoat (or soldermask) 21 is applied over conductive layer 19, leaving an opening to allow the attachment of LESD 24 to conductive layer 19.

Figure 8:
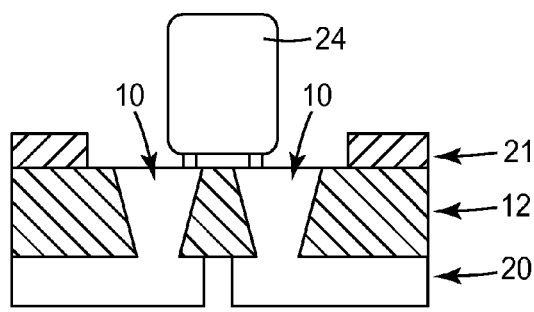
FIG. 8 is a schematic cross-sectional view of an exemplary embodiment of a flexible LESD according to an aspect of the present invention.

FIG. 8 illustrates a dielectric substrate 12 in which are created two vias 10 extending from the top surface to the bottom surface of dielectric layer 12. The vias are filled with conductive material. The conductive material in this embodiment is electrically conductive and preferably thermally conductive. Conductive layer 20 is patterned to form at least two sections that are electrically isolated from each other, but each of which are in electrical contact with the conductive material in one of the vias. Flip chip LESD 24 is mounted on the conductive material in vias 10 such that each electrode is electrically connected to one of the isolated sections of conductive layer 20. Covercoat (or soldermask) 21 is applied over the top surface of dielectric layer 12, leaving an opening to allow the attachment of LESD 24 to the conductive material in vias 10.

Figure 9:
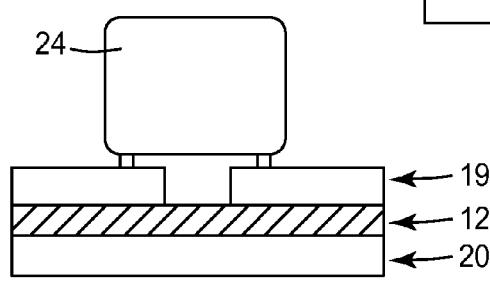
FIG. 9 is a schematic cross-sectional view of an exemplary embodiment of a flexible LESD according to an aspect of the present invention.

FIG. 9 illustrates a thin dielectric substrate 12 (typically about 5 to 15 micrometers thick). Conductive layer 19 on the top surface of dielectric layer 12 is patterned to form at least two sections that are electrically isolated from each other. In this embodiment, conductive layer 19 is electrically conductive and preferably thermally conductive. Conductive layer 20 is on the bottom surface of dielectric layer 12 and is not patterned in FIG. 9, but may be patterned in alternative embodiments. Conductive layer 20 is electrically isolated from conductive layer 19 by dielectric layer 12 and is preferably thermally conductive and optionally electrically conductive in the illustrated embodiment. Flip chip LESD 24 is mounted on conductive layer 19 such that each electrode is electrically connected to one of the isolated sections.

Figure 10:
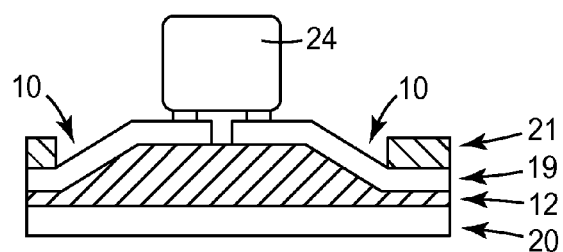
FIG. 10 is a schematic cross-sectional view of an exemplary embodiment of a flexible LESD according to an aspect of the present invention.

FIG. 10 illustrates a dielectric substrate 12 in which are created two cavities 10 extending from the top surface toward the bottom surface of dielectric layer 12. Conductive layer 19 is on the top surface of dielectric layer 12 and extends into cavities 10. It is patterned to form at least two sections that are electrically isolated from each other. In this embodiment, conductive layer 19 is electrically conductive and preferably thermally conductive. Conductive layer 20 is on the bottom surface of dielectric layer 12 and is not patterned in FIG. 10, but may be patterned in alternative embodiments. Conductive layer 20 is electrically isolated from conductive layer 19 by dielectric layer 12 and is preferably thermally conductive and optionally electrically conductive in the illustrated embodiment. Flip chip LESD 24 is mounted on conductive layer 19 such that each electrode is electrically connected to one of the isolated sections and such that it is located between cavities 10. Covercoat (or soldermask) 21 is applied over conductive layer 19 such that it is located in cavities 10, leaving an opening between the cavities to allow the attachment of LESD 24 to conductive layer 19.

Figure 11:
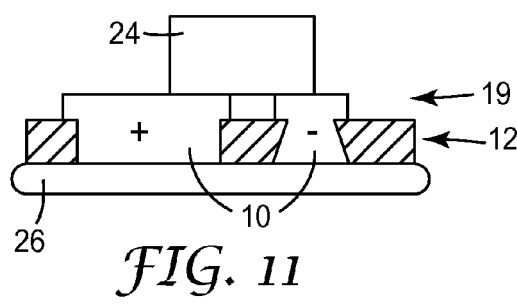
FIG. 11 is a schematic cross-sectional view of an exemplary embodiment of a flexible LESD according to an aspect of the present invention.

FIG. 11 illustrates a dielectric substrate 12 in which are created two vias 10, a large via 10 having vertical walls and a small via 10 extending from the bottom surface to the top surface of dielectric layer 12. The vias are filled with conductive material. The conductive material in this embodiment is electrically conductive and preferably thermally conductive. Conductive layer 19 is patterned to form at least two sections that are electrically isolated from each other, but each of which is in electrical contact with the conductive material in one of the vias. Flip chip LESD 24 is mounted on conductive layer 19 such that each electrode is electrically connected to one of the isolated sections. Thermal interface material (TIM) 26 is applied to the bottom surface of dielectric layer 12 and is in thermal contact with the conductive material in both vias. Although not shown, all flexible LESD embodiments of the present invention may include a TIM layer.

Application of a TIM may further enhance the thermal performance of flexible LESDs according to aspects of the present invention. For example, a layer of TIM may be applied on the bottom side of the flexible LESD. Any suitable TIM may be used in embodiments of the present invention. Depending on the embodiment, the TIM may be applied to the flexible LES device as a liquid, paste, gel, solid, etc. Suitable methods for applying TIM depend on the properties of the specific TIM, but include precision coating, dispensing, screen printing, lamination, etc. Types of materials suitable for use in TIMs include, but are not limited to curable thermosets, thermoplastics, including thermoplastics with conductive fillers, pressure sensitive adhesives, and elastomers. Specific materials suitable for use in TIMs include silicone, polyimide, epoxy, B-stage UV curable adhesives, and high temperature silicon based adhesives.

Suitable TIMs may be filled with thermally conductive material that may or may not also be electrically conductive. Suitable materials include silver, gold, nickel, copper, metal oxides, boron nitride, alumina, magnesium oxides, zinc oxide, aluminum, aluminum oxide, aluminum nitride, silver-coated organic particles, silver plated nickel, silver plated copper, silver plated aluminum, silver plated glass, silver flakes, carbon particles, carbon black, carbon allotropes such as graphite, graphene, carbon nanotubes, boron-nitride coated particles, and mixtures thereof. The thermally conductive materials may be in the form of particles, spheres, flakes, or any other suitable form. In at least some embodiments, the thermally conductive material may comprise about 5 wt % to about 60 wt % of the TIM, preferably about 10 wt % to about 50 wt %.

TIMs suitable for use in the present invention may include, for example, adhesives filled with one or more of alumina, aluminum nitride, boron nitride, carbon nanotubes, carbon particles, and graphene.

Preferably the TIMs have low thermal resistance; are capable of wetting substrates with high surface energy, such as metals, and low surface energy, such as plastics; will remain adhered to the surfaces to which it is attached and will not flow to any unwanted areas of the devices to which it is being applied.

In each of the exemplary embodiments described herein, the vias and cavities may be any suitable shape, e.g., circular, oval, rectangular, serpentine, a channel, a grid (e.g., forming islands of dielectric layer separated by a continuous pattern of overlapping channels), etc., and may contain a single LESD or may contain multiple LESDs. For example, if the via or cavity is channel-shaped or grid-shaped, or large, multiple LESDs may be located in a single via or cavity.

At least one embodiment of the present invention provides a flexible LESD array construction using a partially etched dielectric layer. A cavity is etched into the dielectric layer to a desired depth. The cavities may have a conductive material deposited therein. Any suitable manner of deposition may be used such as coating, vapor deposition, plating etc., but the conductive material is typically plated either using electro or electroless plating. The conductive material in the cavity is preferably thermally conductive and optionally electrically conductive, depending on the requirements for the particular article. LESDs are typically attached directly or indirectly to the conductive material using a known die bonding method such as eutectic, solder (including solder bumps for flip chip mounting), adhesive, and fusion bonding. In at least one embodiment of the present invention, a thermally conducting layer is located on the bottom surface of the dielectric layer and may be a portion of an electrical circuit formed using conventional flexible circuit manufacturing processes. The portion of the dielectric layer that forms the floor of the cavity places the conductive material in the cavity and the conductive layer on the bottom surface of the dielectric material in close proximity, which allows for dissipating heat generated by the LESD efficiently through electrically and thermally conductive material in the cavity, then through the floor of the cavity to the thermally conductive layer on the bottom surface of the dielectric layer.

At least one embodiment of the present invention provides a flexible LESD array construction using a fully etched dielectric layer. A via is etched through the dielectric layer, i.e., from one major surface to an opposite major surface. The bottom opening of the via is typically covered by a conductive layer on the bottom surface of the dielectric layer. In at least one embodiment of the present invention, this conductive layer is a thermally conducting layer and may be a portion of an electrical circuit formed using conventional flexible circuit manufacturing processes. The vias may have a conductive material deposited therein. Any suitable manner of deposition may be used such as coating, vapor deposition, plating etc., but the conductive material is typically plated either using electro or electroless plating. Because the via forms an opening through the dielectric layer, the conductive material in the via and the conductive layer on the bottom surface of the dielectric layer are in direct contact. If both are thermally conductive, this allows for dissipating heat generated by the LESD efficiently through the conductive material in the via to the conductive layer on the bottom surface of the dielectric layer.

In embodiments having conductive material in the cavities or vias, the conductive material may be as thin on the cavity floor or conductive layer covering the via opening as it is on the cavity or via walls, or it may be thinner or thicker. If it is thicker, it may partially or fully fill the cavity or via. For embodiments in which additional conductive material is added in the center of the cavity or via after a layer of conductive material has been applied to at least the walls of the cavity or via, the added conductive material results in a thicker amount of conductive matter in the bottom of the cavity or via than on the (upper) cavity or via walls and, therefore, added conductive material may partially or fully fill the cavity or via. The added conductive material may fill the cavity or via to any suitable level, e.g., 10%, 15%, 25% or greater. In some embodiments, the conductive material fills a larger percentage of the cavity or via, e.g., about 50%, about 75%, or about 100.

In some embodiments, the conductive layer on the top surface of the dielectric layer extends into the cavity or via and forms all or part of the conductive material in the cavity or via. Optionally, additional conductive matter can be deposited in the cavity or via to increase the thickness of the conductive material. In some embodiments, the entire top conductive layer, including the portion that comprises the conductive material in the cavity or via, is made relatively thick and no additional conductive material is added in the cavity or via. In at least some embodiments of the present invention, a top conductive, e.g., copper, layer with a thickness of about 50 um to about 100 um, preferably about 75 um to about 100 um, on the dielectric layer surface, and in the cavity or via, may significantly enhanced heat dissipation away from the LESD.

The conductive layer on the bottom surface of the dielectric layer may be any suitable thickness. Making this conductive layer thick, e.g., about 35 micrometers (um), preferably about 50 um, about 75 um, about 100 um or more may enhance heat removal from the LESDs.

Furthermore, controlling the area dimensions of the cavity floor or bottom via opening can significantly influence heat dissipation from the LESD to the conductive material in the cavity or via and further to the conductive layer on the bottom surface of the dielectric layer. Generally, increasing the ratio of the cavity floor area or via opening to the LESD footprint area provides better heat dissipation. Ratios of 1:2 (LESD footprint: cavity floor area/via opening) and above may improve heat dissipation over a 1:1 ratio, with a ratio of 1:3 believed to provide the most significant increase in heat dissipation. It is believed that this ratio helps dissipate heat in the z direction before spreading the heat out over a larger surface area, e.g., using an adjacent heat transfer layer. Although a ratio of 1:2 might help with heat dissipation and higher ratios such as 1:4 may be used, it is believed that a 1:3 ratio will provide a significant improvement over, e.g., a 1:1 ratio, while a 1:4 ratio may provide only an incremental improvement over a 1:3 ratio.

Suitable conductive matter for use in the electrically and/or thermally conductive layers of the present invention will depend on the application, but may include, for example, conductive metals such as copper, silver, gold, nickel, aluminum, tin, and alloys thereof; thermally and electrically conductive adhesives, including non-conducting adhesives filled with conductive material, e.g., conductive particles, such that the resulting adhesive is conductive.

Suitable conductive matter for use in the conductive materials of the present invention will also depend on the application, but may include metals such as copper, gold, silver, nickel aluminum, tin, and alloys thereof as well as solders, conductive polymers, and conductive adhesives, including non-conductive polymers and adhesives filled with conductive material, e.g., conductive particles, such that the resulting matter is conductive.

Suitable electrically and/or thermally conductive particles include aluminum, gold, silver, chromium, copper, palladium, nickel and alloys thereof, aluminum nitride (AlN), aluminum oxide (Al2O3), barium nitride (BN), nanometer-sized silver particles, carbon blacks, carbon nanotubes (CNT), fullerenes, graphenes, carbon fillers, barium titanate, barium strontium titanate, titanium oxide, lead zirconium titanate, calcium copper titanate, lead magnesium titanate, lead lanthanum zirconate titanate, silicon dioxide, and mixtures thereof.

Suitable polymeric materials for use in the flexible polymeric dielectric layer of the present invention include polyesters, polycarbonates, liquid crystal polymers, and polyimides. Polyimides are preferred. Suitable polyimides include those available under the trade names KAPTON, available from DuPont; APICAL, available from Kaneka Texas corporation; SKC Kolon PI, available from SKC Kolon PI Inc, and UPILEX and UPISEL including UPILEX S, UPILEX SN, and UPISEL VT, all available from Ube Industries, Japan. These UPILEX and UPISEL polyimides are made from monomers such as biphenyl tetracarboxylic dianhydride (BPDA) and phenyl diamine (PDA).

Cavities or vias may be formed in the dielectric layers using any suitable method such as chemical etching, plasma etching, focused ion-beam etching, laser ablation, embossing, microreplication, injection molding, and punching. Chemical etching may be preferred in some embodiments. Any suitable etchant may be used and may vary depending on the dielectric layer material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in co-pending U.S. Provisional Patent Application No. 61/409,791, incorporated herein by reference. Subsequent to etching, the dielectric layers may be treated with an alkaline KOH/potassium permanganate (PPM) solution, e.g., a solution of about 0.7 to about 1.0 wt % KOH and about 3 wt % $KMnO_4$.

The side wall angle resulting from chemical etching varies, and is most dependent on etch rate, with slower etching rates resulting in shallower side wall angles, i.e., closer to 0°. Typical side wall angles resulting from chemical etching are about 5° to 60° from the major plane of the dielectric layer, and in at least one embodiment, about 25° to about 28°. As previously mentioned as an alternative to chemical etching, cavities or vias in the dielectric layer may be formed by punching, plasma etching, focused ion-beam etching, and laser ablation. With these methods of forming a cavity or via, the side walls typically have a steeper angle, e.g., up to 90° from the major plane of the dielectric layer. For purposes of this application, a sloped side wall means a side wall that is not perpendicular to the horizontal plane of the dielectric layer. Cavities or vias with sloped sidewalls could also be made using methods such as embossing, microreplication, and injection molding. If a via is initially formed, but a cavity is desired, a dielectric coating, such as a polyimide coating, may be added to electrically insulate the cavity from a conductive layer on the bottom side of the dielectric layer, thus forming a cavity. The dielectric material may be any suitable material, e.g., a polymeric material, a ceramic material, a particle-loaded polymeric material, etc. and may be applied in any suitable manner. The dielectric coating is electrically insulating and, preferably, thermally conducting to facilitate transfer of heat away from the LESD. One such suitable coating is a polyimide resin formed by first applying a thin layer of polyamic acid resin in the opening. The polyamic acid is preferably precision-coated such that the dielectric coating formed at the bottom of the cavity provides the desired thickness for the cavity floor. The thickness of the cavity floor is preferably about 5% to about 75%, about 5% to about 60%, or about 5% to about 25% of the thickness of the dielectric layer. Subsequently, an imidization process is carried out to form a uniform polyimide coating in the cavity. The polyimide/polyamic acid resin can be applied using precision coating, knife coating, or other methods known in the art.

In some embodiments, the dielectric coating may be filled with particles to enhance its electrically insulating and thermally conducting properties. Suitable particles include aluminum nitride (AlN), aluminum oxide (Al2O3), barium nitride (BN), nanometer-sized silver particles, carbon nanotubes (CNT), fullerenes, graphenes, carbon fillers, barium titanate, barium strontium titanate, titanium oxide, lead zirconium titanate, calcium copper titanate, lead magnesium titanate, lead lanthanium zirconate titanate, silicon dioxide, and mixtures thereof.

In some embodiments, a conductive layer may be applied to the bottom side of the dielectric layer before the cavity or via is formed if the cavity- or via-forming method would not destroy the conductive layer, e.g., because the etching depth can be controlled and/or because the cavity- or via-forming method will not etch or degrade the conductive layer, such as with plasma etching, or it may be added after the cavity is formed if the cavity- or via-forming method would destroy the conductive layer, such as with punching.

The dielectric layers may be clad on one or both sides with a conductive layer. If the conductive layer(s) are to be formed into circuits, they may be pre-patterned, or may be patterned during the process of making the flexible LES devices. A multilayer flexible substrate (having multiple layers of dielectric and conductive material) may also be used as a substrate. The conductive layers may be any suitable material, but are typically copper.

At least some embodiments of the flexible LES devices of the present invention provide excellent heat management properties. Due at least in part to the conductive materials in the cavities or vias and thin or absent dielectric floors of the cavities or vias supporting the LESDs, heat generated by the LESDs can be readily transmitted to a thermally conductive layer on the bottom side of the dielectric layer. In this manner, heat can be readily conducted away from the LESD.

In at least one embodiment of the present invention, the conductive layer on the bottom side of the dielectric layer may be a thermally conductive adhesive. The adhesive layer may be used as an etch stop if a via is formed or may be applied to the dielectric layer after the cavity or via is formed. If the thermally conductive adhesive is used as an etch stop, suitable adhesives are those that are resistant to chemicals, especially those resistant to alkali solutions. Other layers may be applied to the opposite side of the thermally conductive adhesive layer (before or after the adhesive is applied to the dielectric layer). For example, thermal interface materials, metal foils, rigid metal plates, heat sinks, etc. can be attached to the adhesive layer. Having the thermally conductive adhesive layer adjacent the cavity or via can enhance the dissipation of heat away from the LESD which sits in the cavity or via. The thermal conductivity of the adhesive can be tailored by adding required amount of suitable thermally conductive particle and by tailoring the thickness of the adhesive. Typical thermally conductive particle used in thermally conductive adhesives are aluminum nitride (AlN), aluminum oxide (Al2O3), barium nitride (BN), nanometer-sized silver particles, carbon nanotubes (CNT), fullerenes, graphenes, carbon fillers, etc. The size of the particles is typically in the sub-micron to micron range. The typical thermal conductivity of such filled adhesives is from about 0.2 to about 6 W/mK.

Suitable adhesive types for use in thermally conductive adhesives include, but are not limited to, epoxies, polyurethanes, polyamideimides, and phenolic resins.

Suitable curing processes for the thermally conductive adhesives include, but are not limited to, thermal, UV, E-beam, UV-beta stage (a combination of UV and thermal cure in which the adhesives are coated onto a liner, subjected to an initial UV cure initially, then laminated onto a substrate and thermally cured), and combinations thereof.

If the adhesive is adhered to a conductive, e.g., copper, layer before being applied to the dielectric layer, the adhesive typically is either coated on a liner and laminated with a copper foil or coated directly on the copper foil. Electrodeposited or rolled annealed coppers are preferred. If the copper has a rough side and a smooth side, it is typically preferable to attach the adhesive to the rough side.

The LESDs can be packaged directly on the flexible substrate, e.g., by applying an encapsulating material over individual LESDs and the cavities or vias in which they are located, or by applying an encapsulant over an array of LESDs and the conductive layer around such LESDs. The encapsulant is preferably a transparent (i.e., having a transmittance over 99%) molding compound. It may optionally be suitable to act as a lens when cured. Silicones and epoxies are suitable encapsulating compounds. It may further contain optical diffusing particles distributed therein. Suitable molding compounds may be purchased, e.g., from Shin-Etsu Chemical Co., Ltd., of Japan and NuSil Silicone Technology of Santa Barbara, Calif. If desired, a wavelength converting material, such as a phosphor coating, may be deposited on top of the LESD prior to encapsulation. An underfill material may optionally be applied prior to encapsulating the LESD. The flexible LES devices may also be enclosed in a waterproof/weatherproof, transparent casing, which may be made from any suitable polymeric transparent material.

In at least one embodiment of the present invention, the encapsulant is a transparent color conversion material, which can absorb light emitted from the LES of the LESD and re-emit the light at a different, typically higher, wavelength. For example, a color conversion material containing yellow phosphors may be used to encapsulate a blue LED, which can produce a white light. In some embodiments of the present invention, the slopes of the cavity or via sidewalls can be tailored to create a uniform thickness of the color conversion layer surrounding the LESD to provide uniform light conversion, and preferably, superior thermal management.

In at least one embodiment of the present invention, the slopes of the cavity or via sidewalls are about 5° to about 90°. An advantage of at least one embodiment of the present invention is that placing the LESD in a cavity or via enables precise placement of the encapsulant because it can be contained in the cavity or via. An advantage of at least one embodiment of the present invention is that placing the LESD in the center of a cavity or via and filling the cavity or via with encapsulant creates uniform light conversion due to the uniform layer of encapsulant that can be created around the LESD. In an alternate embodiment of the present invention, instead of encapsulating the LESD with the color conversion material, a layer of the color conversion material is coated in the cavity or via prior to placing the LESD in the cavity or via. In this manner, the color conversion material can absorb at least some of the light emitted from the LES and re-emit the light at a different, typically higher, wavelength. An example of a suitable color conversion material is a phosphor-filled encapsulant. Such an encapsulant may be made by mixing yellow phosphor, such as that available under the trade designation ISIPHOR SSA612100 from Merck, with a suitable silicone encapsulant having suitable adhesion properties. A weight ratio of 75% phosphor to silicone adhesive may be suitable in some embodiments. After the encapsulant is dispensed into the cavity or via, in some embodiments it may be cured by exposure to UV light at 80° C. for an hour.

In at least some embodiments of the present invention, the dielectric layer and the conductive layers on one or both of the major surfaces of the dielectric layer and surround the LESDs, thereby providing a flexible, robust LESD package.

The flexible LES devices can be made in a batch process or a continuous process such as a roll-to-roll process that is often used in making flexible circuits. The LESDs can then be divided as desired, e.g., singulated into individual LESDs, strips of LESDs, or arrays of LESDs, e.g., by stamping or by slitting the substrate. Accordingly, an entire reel of LESDs on a flexible substrate can be shipped without the need for the traditional tape and reel process in which individual LESDs are typically transported in individual pockets of a carrier tape.

Before or after forming individual, strips, or arrays of LESDs, the flexible LESDs can be attached to an additional substrate, for example by attaching the conductive layer on the second major surface of the dielectric layer to the additional substrate with a thermally conductive adhesive. The thermally conductive adhesive can further facilitate the transfer of heat away from the LESD. Alternatively, the conductive layer on the second major surface of the dielectric layer may be treated with metals or other materials that will facilitate its adhesion to a substrate. The substrate may also be thermally conductive, e.g., a rigid metal strip, or may be a semiconductor or ceramic substrate, which may or may not be electrically conductive.

The flexible LES devices can be attached to any desired substrate, depending on their intended use. For example, they can be attached to flexible or rigid metal substrates, such as copper or aluminum, heat sinks, dielectric substrates, circuit boards, etc. If the LESDs are for use on a circuit board, the flexible LES devices, whether in singulated, strip, or array form can be directly attached to an end user's circuit board, thereby eliminating the need for conventional lead frame materials. If the LESDs are for use as a lighting strip, they could be enclosed in a waterproof/weatherproof, transparent casing, as described above. If the LESDs are in strip or array form, they may be electrically connected to one or more of the other LESDs in the strip or array. Additional elements such as Zener diodes and Schottky diodes can also be added to the flexible substrate prior to be division of the flexible LES devices. These elements may also be electrically connected to the LESDs.

Figure 12A:
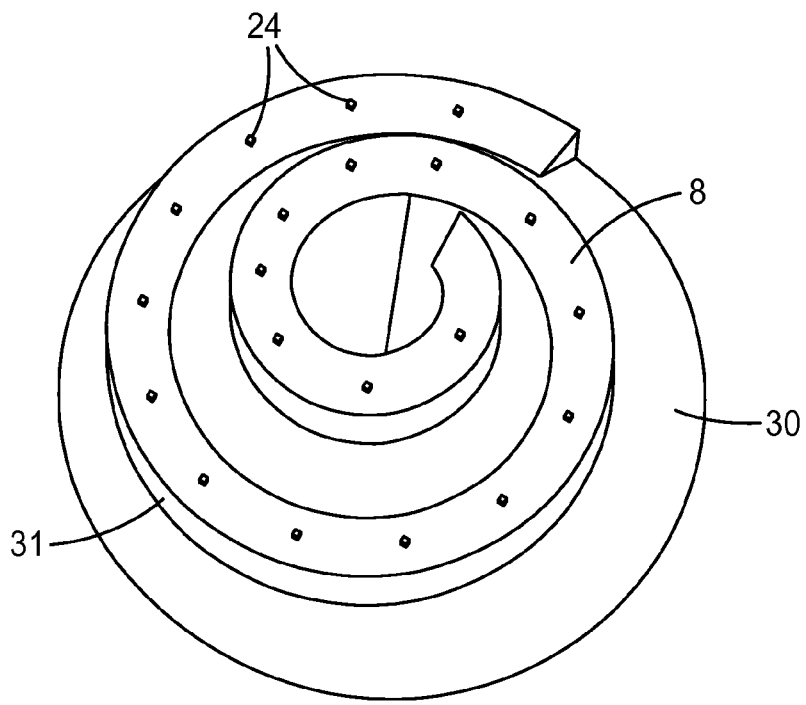
FIGS. 12A and 12B are perspective and side schematic views of another exemplary embodiment of a flexible LESD according to an aspect of the present invention.
Figure 12B:
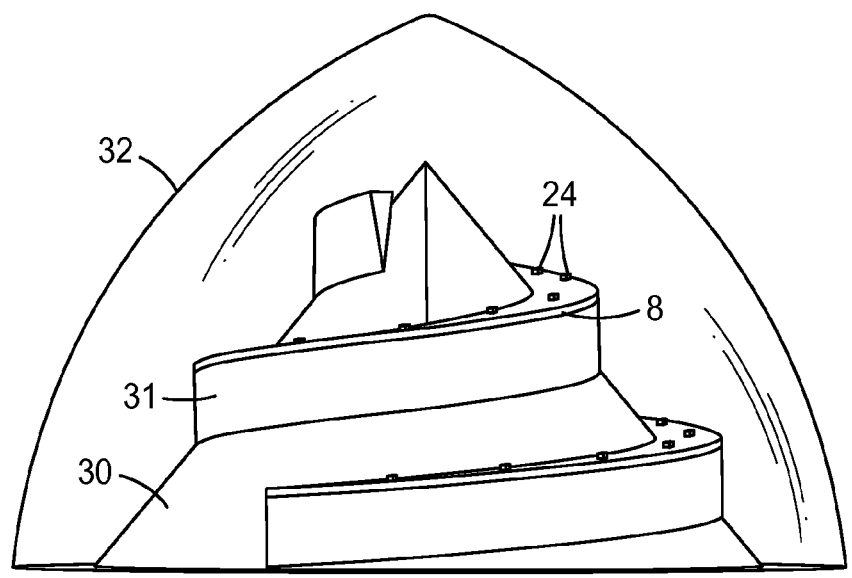

In at least one embodiment of the present invention, the flexible LES devices are thinner than conventional single or multiple LESD packages because the LESD sits below the surface of the dielectric layer. This enables the flexible LES devices of the present invention to be used in applications with tight volume restrictions, such as cell phones and camera flashes. For example, the flexible LES devices of the present invention can provide a package profile of approximately 0.7 to 4 mm, and in some embodiments 0.7 to 2 mm whereas conventional LESD package profiles are typically greater than 4 mm and are approximately 4.8 mm to 6.00 mm. Moreover, the flexible LES devices of the present invention can be flexed or bent to easily fit into a non-linear or non-planar assembly if desired. This makes the flexible LES devices of the present invention particularly useful for various types of light emitting devices such as light bulbs, lighting fixtures, and various automotive lighting applications including, but not limited to, head lights, dome lights, tail lights, running lights, fog lights, marker lights, grill lights, and decorative lights. FIGS. 12A and 12B illustrate an embodiment of a flexible LESD in a headlight application. The flexible LESD comprises a flexible circuit 8 on which are located multiple LESDs 24. Flexible circuit 8 is located on a spiral shelf 31, which forms a part of support base 30, which has a generally conical shape. The headlight further comprises a lens or cover 32 positioned over support base 30.

In at least one embodiment, the dielectric layer and copper layers thereon provide a thin and compliant support for the LESDs. In at least one embodiment, the total thickness of the conductive layers is less than 200 micrometers, preferably less than 100 micrometers, and most preferably less than 50 micrometers. In at least one embodiment, the thickness of the dielectric layer is preferably 50 micrometers or less.

In at least one embodiment of the present invention a passivation layer can be applied to the bottom of LESD to facilitate die bonding of the LESD to the conductive feature or to an intermediate material such as a reflective layer. Suitable passivation materials include metals such as Au and intermetallic alloy(s) such as AuSn, AuGe, AuSi.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. An article comprising:
   a flexible circuit having first and second sides comprising a polymeric dielectric layer having first and second major surfaces, one or both of the first and second major surfaces having a conductive layer thereon, wherein at least one conductive layer comprises an electrical circuit configured to power one or more light emitting semiconductor devices located on the flexible circuit, and
   wherein the flexible circuit is shaped to form a three dimensional structure,
   wherein the flexible circuit includes partition lines in the dielectric layer,
   wherein sections of the dielectric layer are separated from each other at the partition lines to form the three dimensional structure, and
   wherein the flexible circuit has a geometry such that if the flexible circuit were placed in a plane, adjacent sections of the dielectric layer would meet along substantially an entire length of one of the partition lines.

2. The article of claim 1 wherein light emitting semiconductor devices are located on both sides of the flexible circuit.

3. The article of claim 2 wherein the flexible circuit is folded such that all of the light emitting semiconductor devices face a similar direction.

4. The article of claim 1 wherein the flexible circuit is bent to form the three dimensional structure.

5. The article of claim 1 wherein the flexible circuit is folded to form the three dimensional structure.

6. The article of claim 1 wherein the flexible circuit is adhered on one side to a thermal interface material.

7. The article of claim 6 wherein the thermal interface material is adhered to a thermally-conductive substrate.

8. The article of claim 7 wherein the thermally-conductive substrate is a heat sink.

9. The article of claim 6 wherein the thermal interface material is a thermally conductive adhesive.

10. The article of claim 1 wherein the flexible circuit is adhered to a substrate having a reflective surface.

11. The article of claim 1 wherein the flexible circuit is adhered to a substrate having a reflective surface such that the reflective surface is visible between the separated sections of the dielectric layer.

12. The article of claim 1, wherein the flexible circuit is adhered to a component of a light emitting device.

13. The article of claim 12 wherein the light emitting device is a light bulb.

* * * * *